United States Patent
Hsu et al.

(10) Patent No.: US 9,832,093 B1
(45) Date of Patent: Nov. 28, 2017

(54) METHOD FOR INJECTING TIMING VARIATIONS INTO CONTINUOUS SIGNALS

(71) Applicant: Keysight Technologies, Inc., Minneapolis, MN (US)

(72) Inventors: Chia Jui Hsu, Thousand Oaks, CA (US); Fangyi Rao, San Jose, CA (US)

(73) Assignee: Keysight Technologies, Inc., Santa Rosa, CA (US)

(*) Notice: Subject to any disclaimer, the term of this patent is extended or adjusted under 35 U.S.C. 154(b) by 255 days.

(21) Appl. No.: 14/191,257

(22) Filed: Feb. 26, 2014

(51) Int. Cl.
*H04L 7/04* (2006.01)
*H04B 7/212* (2006.01)
*H04L 12/26* (2006.01)
*G01R 31/28* (2006.01)

(52) U.S. Cl.
CPC ........ *H04L 43/087* (2013.01); *G01R 31/2882* (2013.01)

(58) Field of Classification Search
CPC ........ G01R 31/31709; G01R 31/31937; G01R 31/31922; G01R 31/31725; G01R 31/31917; G01R 31/31715; G01R 31/2882; G01R 31/3191
USPC .......................................... 375/362; 370/442
See application file for complete search history.

(56) References Cited

U.S. PATENT DOCUMENTS

| 5,031,230 | A | * | 7/1991 | Sandahl | H03L 7/18 375/362 |
| 5,124,597 | A | * | 6/1992 | Stuebing | H03K 5/133 327/261 |
| 7,839,747 | B2 | * | 11/2010 | Tieke | G11B 7/0062 369/59.11 |
| 7,932,729 | B2 | * | 4/2011 | Watanabe | G01R 29/26 324/527 |
| 8,060,054 | B1 | * | 11/2011 | Dinan | H04W 52/0216 455/343.4 |
| 2001/0002799 | A1 | * | 6/2001 | Saeki | G06F 1/10 327/292 |
| 2002/0080812 | A1 | * | 6/2002 | Stadler | H04J 3/0623 370/442 |
| 2004/0120628 | A1 | * | 6/2004 | Tuyl | H04B 10/299 385/11 |
| 2005/0060597 | A1 | * | 3/2005 | Albonesi | G06F 1/10 713/600 |
| 2007/0036256 | A1 | * | 2/2007 | Yamaguchi et al. | 375/371 |
| 2007/0203418 | A1 | * | 8/2007 | Starc | A61B 5/04525 600/509 |
| 2009/0157376 | A1 | * | 6/2009 | Hollis | 703/16 |

* cited by examiner

*Primary Examiner* — Daniel Washburn
*Assistant Examiner* — Sarah Hassan

(57) ABSTRACT

A method of operating a data processing system to generate a jitter-injected signal from an input signal that is a function of time is disclosed. A time offset corresponding to a first time is generated according to a jitter specification that specifies the offset as a function of time. The jitter-injected signal at the first time is generated by evaluating the input signal at a time equal to a sum of the time offset and the first time. If the jitter specification only provides offsets at signal crossing times, interpolation is used to derive time offsets at non-signal crossing times.

12 Claims, 2 Drawing Sheets

METHOD FOR INJECTING TIMING VARIATIONS INTO CONTINUOUS SIGNALS

BACKGROUND

Circuit simulation is widely used to test circuit designs prior to the actual implementation of the circuit in hardware. One circuit behavior that is important to emulate in simulators is the effect of jitter. For the purposes of the present discussion, jitter is defined to be the difference between the signal's expected threshold crossing time and the actual crossing time. Jitter can be the result of a number of effects in a circuit including imperfections in the clock signals and inter-symbol-interference. To analyze the effects of jitter on a circuit, a mechanism for injecting the jitter into an input or output signal to or from a component in the circuit is needed. Jitter injection to continuous signals has important applications in system analyses and measurements. For example, jitter is injected into input signals to study system tolerances to timing impairments. In system level designs, jitter is injected to outputs of functional blocks when simulating full system performances to simulate the jitter introduced by that functional block. A complex system can be studied by allowing one or more functional blocks to inject jitter into the signals being processed by the blocks.

SUMMARY

The present invention includes a method of operating a data processing system to generate a jitter signal from an input signal that is a function of time. The method includes generating a time offset corresponding to a first time according to a jitter specification that specifies the offset as a function of time, and generating a jittered signal at the first time by evaluating the input signal at a time equal to a sum of the time offset and the first time.

In one aspect of the invention, the jitter specification is only defined for jitter times that are related to the crossing times at which the input signal crosses a threshold value. The method of the present invention determines the jitter times by detecting the crossing times in the input signal.

In another aspect of the invention, the jitter times are defined in terms of a clock frequency and the detected crossing times are used to determine the clock frequency.

In yet another aspect of the invention, a plurality of time offsets are generated according to the jitter specification at times corresponding to the jitter times. For times other than the jitter times, the time offset is generated by interpolating the generated time offsets at the jitter times.

DETAILED DESCRIPTION

Figure 1:
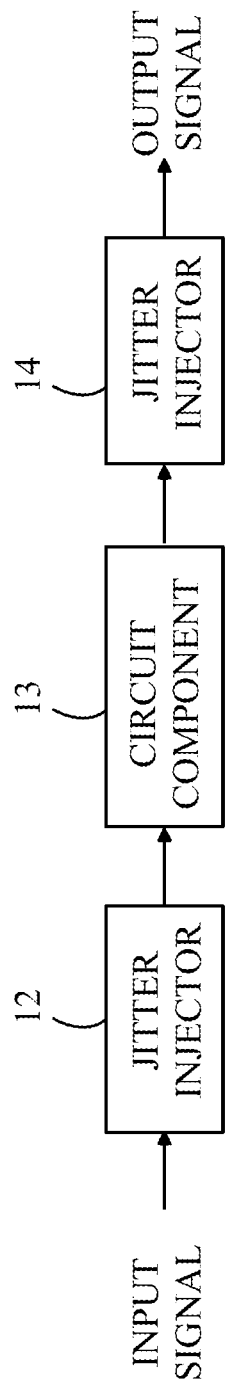
FIG. 1 illustrates the use of jitter injectors according to the present invention to simulate jitter.

The manner in which the present invention provides its advantages can be more easily understood with reference to FIG. 1, which illustrates the use of jitter injectors according to the present invention to simulate jitter. To simulate jitter in an input signal to a circuit component 13, a jitter injector 12 converts the input signal to a jittered input signal. To simulate jitter added by circuit component 13, a jitter injector 14 processes the output of circuit component 13 to generate an output signal. It should be noted that this arrangement provides an output signal that has an accumulation of jitter effects. For the purposes of the present discussion, a "jittered signal" based on a signal V(t) is defined to be $$V_j(t) = V(t + \tau(t)),$$

where $\tau(t)$ is a function that characterizes the jitter. This function will be referred to as the jitter specification in the following discussion. It should be noted that $\tau(t)$ can be a continuous smooth function such as a sinusoidally time-varying jitter function or a random or pseudo random sequence. In the case of random jitter with a uniform probability distribution function between $-\tau_{max}$ and $\tau_{max}$, $\tau(t)$ at jitter times can be generated by randomly picking values between $-\tau_{max}$ and $\tau_{max}$.

Consider the case in which V(t) is a continuous signal that crosses a threshold repeatedly. The injected jitter causes the signal to cross the threshold at times that are different from the original crossing times. If $\tau(t)$ is known for all t values, $V_j(+\tau(t))$ can be evaluated directly. However, in some cases of interest, $\tau(t)$ is only known at the signal crossing times. For example, in a randomly varying $\tau(t)$, the probability function may only be defined as the uncertainty in the crossing times at bit boundaries. In such cases, it is important that discontinuities are not introduced into $V_j(t)$ by the unknown values of $\tau(t)$ between the points at which the jitter specification is defined.

In one aspect of the invention, the values of $\tau(t)$ at the times other than the times at which $\tau$ is defined are obtained by interpolating the known values of $\tau(t)$. Consider the case in which $\tau(t)$ is defined in terms of a random distribution that specifies the probability of a given $\tau$ value at times relative to a bit boundary. In this case, the $\tau$ values at times other than the bit crossing times are not defined. The times for which $\tau(t)$ is defined by the jitter specification will be referred to as "jitter times" in the following discussion. If $\tau(t)$ were set to zero at times other than the jitter times, discontinuities would be introduced in $V_j(t)$. The present invention avoids these discontinuities by generating $\tau(t)$ for the jitter times using the jitter specification. This set of discrete $\tau(t)$ values is then interpolated to provide $\tau(t)$ values at times other than the jitter times.

The jitter times are often defined for the bit boundaries in the input signal. The locations of some of these boundaries can be determined by determining the times at which the input signal crosses a threshold value corresponding to a transition between a one and a zero in the input signal. If it is assumed that the boundaries occur at regular intervals such as clock boundaries, the observed crossings can be used to deduce the clock frequency. Hence, the location of the other jitter times can be inferred from the observed clock frequency and the observed signal crossings. It should be noted that the input signal could also be a signal that has been subjected to jitter by some prior processing of a non-jittered signal. In this case, the clock frequency and signal crossing points will be approximations to actual clock crossings. For the case in which the jitter times are defined by a clock, denote the $k^{th}$ clock time by $t^{clk}_k$. The jitter specification provides the values for $\tau(t^{clk}_k)$. For times other than these jitter times, $\tau(t)$ is determined by smoothly interpolating a plurality of $\tau(t^{clk}_k)$ values that are nearest to t. In the simplest case, a linear interpolation of the nearest two $\tau(t^{clk}_k)$ values is utilized. However, higher order interpolation schemes including least squares interpolation can also be utilized.

As noted above, the input signal itself could be a jittered signal. For example, the input to jitter injector 14 shown in FIG. 1 includes the effects of the jitter introduced by jitter injector 12. In one exemplary embodiment, the clock recovery algorithm assumes that the clock times are approximated by a constant clock frequency that is determined by observing the recent crossings in the input signal. This approximated clock frequency and the location of the most recent crossings are used to predict the time of the next clock boundaries at which the jitter specification is applied. That is, the values of $\tau(t^{clk}_k)$ are computed for these time values of $t^{clk}_k$. Those values are then interpolated to provide the values of z at times other than $t^{clk}_k$. It should be noted that the input signal could have significant segments in which no thresholds are crossed. For example, a binary signal for a string of 1s or 0s presents such a problem. During such segments, the clock times are assumed to be those predicted from the previously computed clock frequency and last threshold boundary crossings. When a new threshold crossing is finally detected, the clock frequency and crossing times are updated accordingly.

Figure 2:
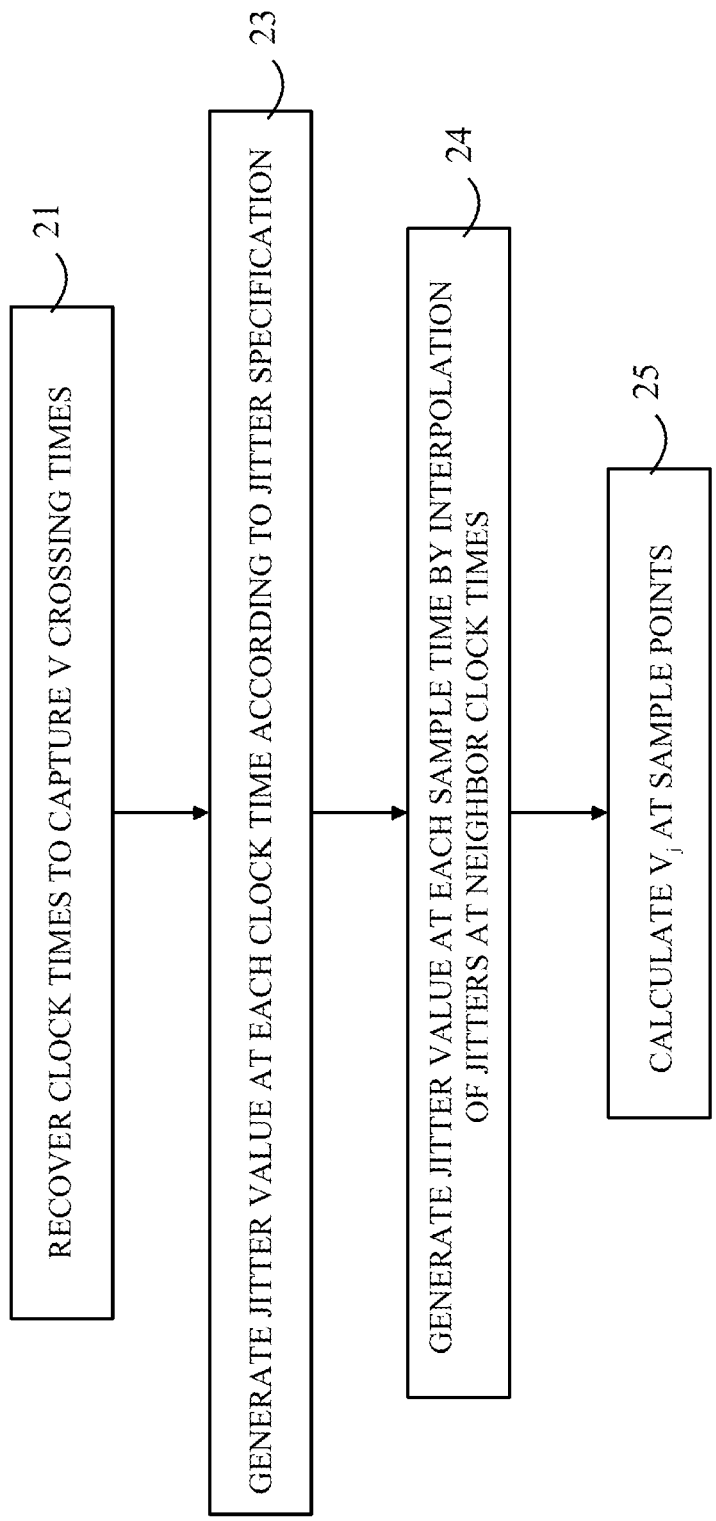
FIG. 2 is a flow chart of an algorithm for generating $\tau(t)$ values at times other than crossing times.

Refer now to FIG. 2, which is a flow chart of an algorithm for generating $\tau(t)$ values at times other than crossing times. Initially, the clock times (signal crossing times) are recovered from V(t) as shown at 21. Next, the $\tau$ values for each of the clock times are computed using the jitter specification as shown at 23. The form of the specification will depend on the particular jitter model. In general, the specification provides a method for computing $\tau(t)$ at the signal crossing points of the non-jittered signal. For example, the specification may be based on a probability distribution as discussed above. Next, the $\tau(t)$ values at each sample point are generated by interpolation of the $\tau(t^{clk}_k)$ values as shown at 24. Finally, the jitter injected signal $V_j(t)$ is computed for the various sample times as shown at 25.

In real-time systems, the necessary samples of the signal V to evaluate $V(t_n+\tau(t_n))$ may not be known at $t_n$. In such systems, a delay of one or more samples or clock periods can be introduced into the computation to allow for the required value to be determined.

The present invention can be practiced on any circuit simulation hardware. Such hardware includes general purpose data processing systems and specialized hardware that accelerate such computations.

The present invention also includes a computer readable medium that stores instructions that cause a data processing system to execute the method of the present invention. A computer readable medium is defined to be any medium that constitutes patentable subject matter under 35 U.S.C. 101 and excludes any media that does not constitute patentable subject matter under 35 U.S.C. 101. Examples of such media include non-transitory media such as computer memory devices that store information in a format that is readable by a computer or data processing system.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method of operating a data processing system to generate a jitter signal from an input signal that is a function of time, said method comprising:
    generating a time offset corresponding to a first time according to a jitter specification that specifies said time offset as a function of time; and
    generating said jitter signal at said first time by evaluating said input signal at a time equal to a sum of said time offset and said first time.

2. The method of claim 1 further comprising detecting crossing times at which said input signal crosses a threshold value.

3. The method of claim 2 wherein said jitter specification is only defined for jitter times related to said detected crossing times and wherein said jitter times are determined from said detected crossing times.

4. The method of claim 3 further comprises generating a plurality of time offsets according to said jitter specification at times corresponding to said jitter times and generating time offsets at times other than said jitter times by interpolating said plurality of time offsets.

5. The method of claim 1 wherein said jitter specification comprises a random sequence of offsets having a distribution specified by predetermined probability distribution.

6. A method of operating a data processing system to generate a jitter signal from an input signal that is a function of time, said method comprising:
    generating a time offset corresponding to a first time according to a jitter specification that specifies said time offset as a function of time; and
    generating said jitter signal at said first time by evaluating said input signal at a time equal to a sum of said time offset and said first time; and
    further comprising detecting crossing times at which said input signal crosses a threshold value;
wherein said jitter specification is only defined for jitter times related to said detected crossing times and wherein said jitter times are determined from said detected crossing times; and
    wherein said jitter times are defined in terms of a clock frequency and wherein said crossing times are used to determine said clock frequency.

7. A computer readable medium comprising instructions that cause a data processing system to execute a method for generating a jitter signal from an input signal that is a function of time, said method comprising:
    generating a time offset corresponding to a first time according to a jitter specification that specifies said time offset as a function of time; and
    generating said jitter signal at said first time by evaluating said input signal at a time equal to a sum of said time offset and said first time.

8. The computer readable medium of claim 7 further comprising detecting crossing times at which said input signal crosses a threshold value.

9. The computer readable medium of claim 8 wherein said jitter specification is only defined for jitter times related to said detected crossing times and wherein said jitter times are determined from said detected crossing times.

10. The computer readable medium of claim 9 wherein said jitter times are defined in terms of a clock frequency and wherein said crossing times are used to determine said clock frequency.

11. The computer readable medium of claim 9 further comprises generating a plurality of time offsets according to said jitter specification at times corresponding to said jitter times and generating time offsets at times other than said jitter times by interpolating said plurality of time offsets.

12. The computer readable medium of claim 7 wherein said jitter specification comprises a random sequence of offsets having a distribution specified by predetermined probability distribution.

* * * * *